United States Patent
Shibusawa

(10) Patent No.: US 7,335,914 B2
(45) Date of Patent: Feb. 26, 2008

(54) DISPLAY, ARRAY SUBSTRATE, AND DISPLAY MANUFACTURING METHOD

(75) Inventor: Makoto Shibusawa, Fukaya (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 183 days.

(21) Appl. No.: 11/312,758

(22) Filed: Dec. 21, 2005

(65) Prior Publication Data
US 2006/0138420 A1  Jun. 29, 2006

(30) Foreign Application Priority Data
Dec. 27, 2004  (JP)  ............... 2004-378257

(51) Int. Cl.
*H01L 29/04* (2006.01)
(52) U.S. Cl. ............. 257/59; 257/72; 257/83; 257/257; 257/296; 257/E33.001
(58) Field of Classification Search ............... 257/59, 257/72, 83, 257, 296
See application file for complete search history.

(56) References Cited

U.S. PATENT DOCUMENTS

| | | | |
|---|---|---|---|
| 6,278,131 B1 * | 8/2001 | Yamazaki et al. ............ 257/59 |
| 6,373,454 B1 | 4/2002 | Knapp et al. | |
| 6,759,682 B2 * | 7/2004 | Bae ............................. 257/72 |
| 7,122,832 B2 * | 10/2006 | Nishikawa .................. 257/59 |
| 2002/0079494 A1 * | 6/2002 | Kim et al. ..................... 257/72 |
| 2006/0138420 A1 | 6/2006 | Shibusawa | |

OTHER PUBLICATIONS

U.S. Appl. No. 11/208,653, filed Aug. 23, 2005, Shibusawa.
U.S. Appl. No. 11/312,761, filed Dec. 21, 2005, Shibusawa.
U.S. Appl. No. 11/312,758, filed Dec. 21, 2005, Shibusawa.
U.S. Appl. No. 11/555,302, filed Nov. 1, 2006, Shibusawa.
U.S. Appl. No. 11/363,048, filed Feb. 28, 2006, Shibusawa.
U.S. Appl. No. 11/658,044, filed Jan. 22, 2007, Shibusawa.

* cited by examiner

*Primary Examiner*—Wai-Sing Louie
(74) *Attorney, Agent, or Firm*—Oblon, Spivak, McClelland, Maier & Neustadt, P.C.

(57) ABSTRACT

Each pixel of a display includes a first thin film transistor whose source is connected to a first power supply terminal, a second thin film transistor which is different in conduction type from the first thin film transistor and whose source and drain are connected to the drain of the first thin film transistor and the first power supply terminal, respectively, an output control switch, and a display element connected in series with the output control switch between a second power supply terminal and the drain of the first thin film transistor.

4 Claims, 5 Drawing Sheets

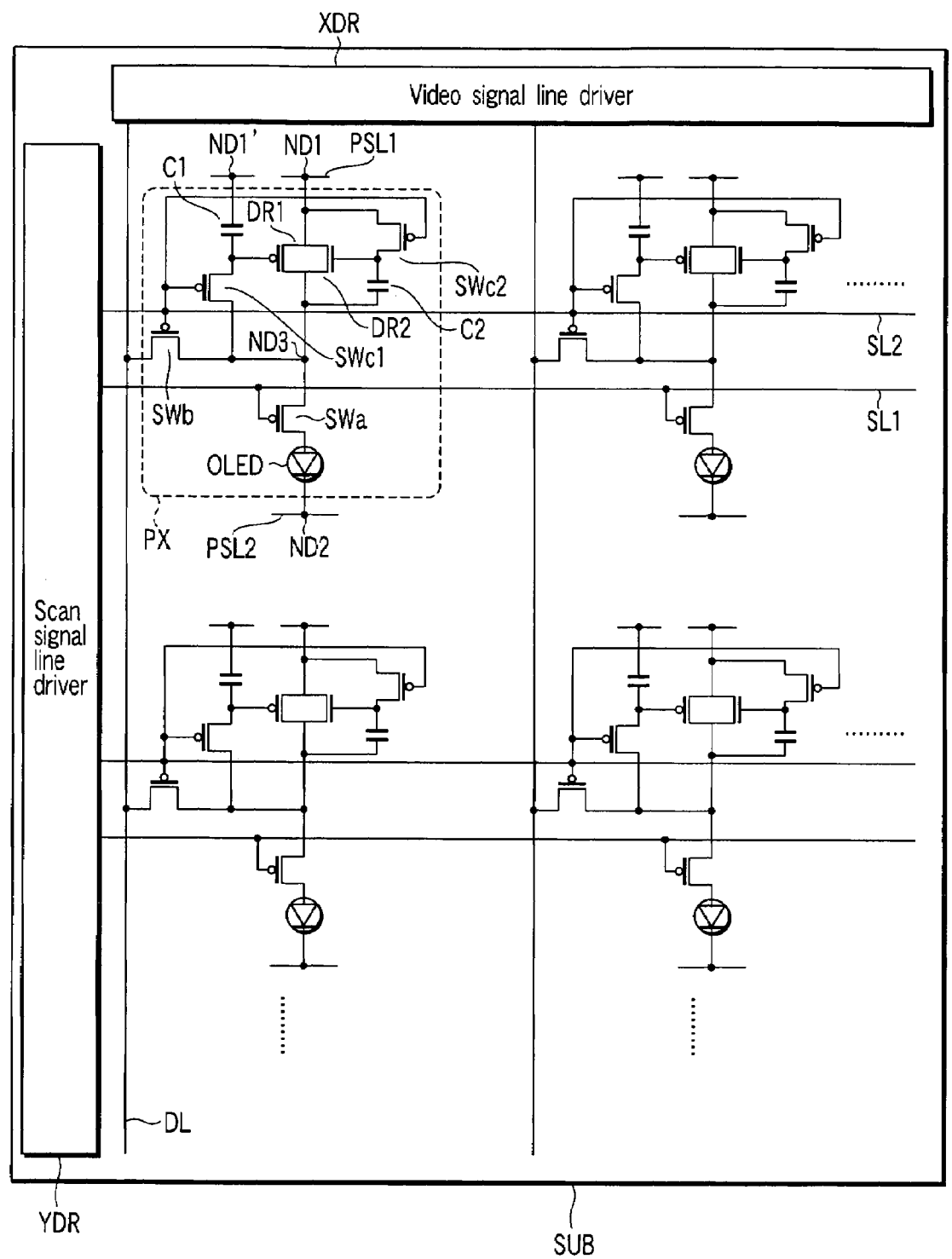
F I G. 1

DISPLAY, ARRAY SUBSTRATE, AND DISPLAY MANUFACTURING METHOD

CROSS-REFERENCE TO RELATED APPLICATIONS

This application is based upon and claims the benefit of priority from prior Japanese Patent Application No. 2004-378257, filed Dec. 27, 2004, the entire contents of which are incorporated herein by reference.

BACKGROUND OF THE INVENTION

1. Field of the Invention

The present invention relates to a display, array substrate, and display manufacturing method.

2. Description of the Related Art

In a display such as an organic electroluminescent (EL) display in which the optical characteristics of display elements are controlled by drive currents supplied to the elements, image quality fluctuations such as luminance unevenness occur if the drive currents vary. Therefore, if an active matrix driving method is used in a display like this, the characteristics of drive control elements each of which is included in a pixel and controls the magnitudes of the drive current must be substantially the same. In this display, however, the drive control elements are generally formed on an insulator such as a glass substrate, the characteristics readily vary.

U.S. Pat. No. 6,373,454 describes an organic EL display using a current mirror circuit in a pixel.

This pixel includes an n-channel field effect transistor (FET) as a drive control element, an organic EL element, and a capacitor. The source of the n-channel FET is connected to a low-potential power supply line, and the capacitor is connected between the gate of the n-channel FET and the power supply line. Also, the anode of the organic EL element is connected to a high-potential power supply line.

This pixel is driven by the following method.

First, the drain and gate of the n-channel FET are connected to each other, and an electric current $I_{sig}$ corresponding to a video signal is supplied to the drain-to-source path of the n-channel FET in this state. By this operation, the voltage between the two electrodes of the capacitor is set at a gate-to-source voltage necessary to make the electric current $I_{sig}$ flow through the n-channel FET.

Then, the drain and gate of the n-channel FET are disconnected from each other, and the voltage between the two electrodes of the capacitor is held. Subsequently, the drain of the n-channel FET is connected to the cathode of the organic EL element. As a consequence, a drive current $I_{drv}$ having a magnitude substantially equal to that of the electric current $I_{sig}$ flows though the organic EL element. The organic EL element emits light at luminance corresponding to the magnitude of the drive current $I_{drv}$.

As described above, when the current mirror circuit is used in a pixel, the drive current $I_{drv}$ having a magnitude substantially equal to that of the electric current $I_{sig}$ supplied as a video signal during a write period can be supplied between the drain and source of the n-channel FET even in a holding period following the write period. This makes it possible to eliminate the influence of not only a threshold value $V_{th}$ but also the mobility, dimensions, and the like of the n-channel FET on the drive current $I_{drv}$.

The present inventor, however, has found that display unevenness may occur even in a display using the current mirror circuit described above in a pixel.

BRIEF SUMMARY OF THE INVENTION

According to a first aspect of the present invention, there is provided a display comprising an insulating substrate, pixels arranged in a matrix form on the insulating substrate, and video signal lines arranged correspondently with columns which the pixels form, wherein each of the pixels comprises a first thin film transistor including a polycrystalline semiconductor layer in which source, drain and channel are formed, the source of the first thin film transistor being connected to a first power supply terminal, a second thin film transistor different in conduction type from the first thin film transistor and including a polycrystalline semiconductor layer in which source, drain and channel are formed, the source of the second thin film transistor being connected to the drain of the first thin film transistor, and the drain of the second thin film transistor being connected to the first power supply terminal, a first capacitor connected between a constant potential terminal and a gate of the first thin film transistor, a second capacitor connected between the source of the second thin film transistor and a gate of the second thin film transistor, switch group including a first diode-connecting switch and a video signal supply control switch and switching a connection state between first and second states, the first state being a state that the gate of the first thin film transistor, the drain of the first thin film transistor, and the video signal line are electrically connected to one another, and the second state being a state that the gate of the first thin film transistor, the drain of the first thin film transistor, and the video signal line are electrically disconnected from one another, a second diode-connecting switch connected between the source of the second thin film transistor and the gate of the second thin film transistor, an output control switch, and a display element, the display element and the output control switch being connected in series between a second power supply terminal and the drain of the first thin film transistor.

According to a second aspect of the present invention, there is provided an array substrate comprising an insulating substrate, pixel circuits arranged in a matrix form on the insulating substrate, and video signal lines arranged correspondently with columns which the pixel circuits form, wherein each of the pixel circuits comprises a first thin film transistor including a polycrystalline semiconductor layer in which source, drain and channel are formed, the source of the first thin film transistor being connected to a first power supply terminal, a second thin film transistor different in conduction type from the first thin film transistor and including a polycrystalline semiconductor layer in which source, drain and channel are formed, the source of the second thin film transistor being connected to the drain of the first thin film transistor, and the drain of the second thin film transistor being connected to the first power supply terminal, a first capacitor connected between a constant potential terminal and a gate of the first thin film transistor, a second capacitor connected between the source of the second thin film transistor and a gate of the second thin film transistor, switch group including a first diode-connecting switch and a video signal supply control switch and switching a connection state between first and second states, the first state being a state that the gate of the first thin film transistor, the drain of the first thin film transistor, and the video signal line are electrically connected to one another, and the second state being a state that the gate of the first thin film transistor, the drain of the first thin film transistor, and the video signal line are electrically disconnected from one another, a second diode-connecting switch connected between the source of the second thin film transistor and the gate of the second thin film transistor, and an output control switch which is to be connected in series with a display element between a second power supply terminal and the drain of the first thin film transistor.

According to a third aspect of the present invention, there is provided a method of manufacturing the display according to the first aspect, comprising simultaneously forming the polycrystalline semiconductor layers of the first and second thin film transistor on the insulating substrate at each of positions corresponding to the pixels, and simultaneously doping the polycrystalline semiconductor layers of the first and second thin film transistor with an impurity at each of positions corresponding to the pixels.

BRIEF DESCRIPTION OF THE SEVERAL VIEWS OF THE DRAWING

FIG. 1 is a plan view schematically showing a display according to an embodiment of the present invention;

DETAILED DESCRIPTION OF THE INVENTION

Figure 2:
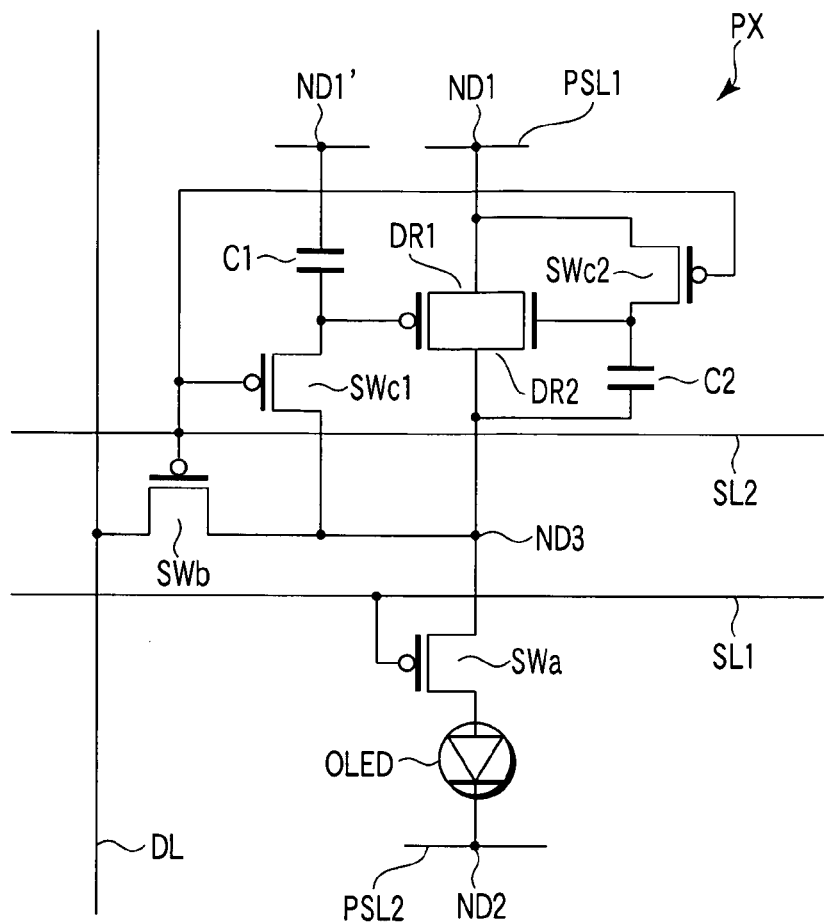
FIG. 2 is an equivalent circuit diagram of a pixel included in the display shown in FIG. 1.

An embodiment of the present invention will be described in detail below with reference to the accompanying drawing. Note that the same reference numerals denote constituent elements which achieve the same or similar functions in the drawing, and an repetitive explanation thereof will be omitted.

FIG. 1 is a plan view schematically showing a display according to an embodiment of the present invention. FIG. 2 is an equivalent circuit diagram of a pixel included in the display shown in FIG. 1.

This display is an active matrix display, e.g., an active matrix organic EL display, and includes a plurality of pixels PX. The pixels PX are arranged in a matrix form on an insulating substrate SUB such as a glass substrate.

A scan signal line driver YDR and video signal line driver XDR are mounted on the substrate SUB.

On the substrate SUB, scan signal lines SL1 and SL2 connected to the scan signal line driver YDR run in the row direction (X direction) of the pixels PX. The scan signal line driver YDR supplies scan signals as voltage signals to the scan signal lines SL1 and SL2.

Also, on the substrate SUB, video signal lines DL connected to the video signal line driver XDR run in the column direction (Y direction) of the pixels PX. The video signal line driver XDR supplies video signals to the video signal lines DL.

In addition, first and second power supply lines PSL1 and PSL2 are arranged on the substrate SUB.

Each pixel PX includes first and second drive control elements DR1 and DR2, an output control switch SWa, a video signal supply control switch SWb, first and second diode-connecting switches SWc1 and SWc2, first and second capacitors C1 and C2, and a display element OLED. The video signal supply control switch SWb and first diode-connecting switch SWc1 form a switch group.

The display element OLED includes an anode and cathode facing each other, and an active layer which changes its optical characteristics in accordance with an electric current flowing between the anode and cathode. Assume that, for example, the display element OLED is an organic EL element including an emission layer made of an organic material as the active layer. Assume also that, for example, the anode is formed into the shape of an isolated island as a lower electrode, and the cathode is formed in common to all pixels as an upper electrode facing the lower electrode via the active layer.

The first drive control element DR1 is a thin film transistor (to be referred to as a TFT hereinafter) in which a source, drain, and channel are formed in a polycrystalline semiconductor layer. In this embodiment, a p-channel TFT using a polysilicon layer as the polycrystalline semiconductor layer is used as the first drive control element DR1 as an example. The source of the first drive control element DR1 is connected to the power supply line PSL1. Note that a node ND1 of the power supply line PSL1 is a first power supply terminal.

The second drive control element DR2 is a TFT in which a source, drain, and channel are formed in a polycrystalline semiconductor layer, and which is different in conduction type from the first drive control element DR1. In this embodiment, an n-channel TFT using a polysilicon layer as the polycrystalline semiconductor layer is used as the second drive control element DR2 as an example. The source and drain of the second drive control element DR2 are connected to the drain of the first drive control element DR1 and the power supply line PSL1, respectively.

The output control switch SWa and display element OLED are connected in series between the drain of the first drive control element DR1 and the power supply line PSL2. Note that a node ND2 on the power supply line PSL2 is a second power supply terminal. In this embodiment, a p-channel TFT is used as the output control switch SWa. The gate, source, and drain of this p-channel TFT are connected to the scan signal line SL1, the drain of the first drive control element DR1, and the anode of the display element OLED, respectively. Also, in this embodiment, the electric potential of the second power supply terminal ND2 is lower than that of the first power supply terminal ND1. Note that in this embodiment the output control switch SWa and display element OLED are connected in series in this order between the drain of the first drive control element DR1 and the second power supply terminal ND2, but the connection order may also be reversed.

The video signal supply control switch SWb is connected between the drain of the first drive control element DR1 and the video signal line DL. A switching operation of the video signal supply control switch SWb is controlled by, e.g., a scan signal supplied from the scan signal line driver YDR via the scan signal line SL2. In this embodiment, a p-channel TFT is used as the video signal supply control switch SWb as an example. The gate, source, and drain of this p-channel TFT are connected to the scan signal line SL2, the drain of the first drive control element DR1, and the video signal line DL, respectively.

The first diode-connecting switch SWc1 is connected between the gate and drain of the first drive control element DR1. A switching operation of the first diode-connecting switch SWc1 is controlled by, e.g., a scan signal supplied from the scan signal line driver YDR via the scan signal line SL2. In this embodiment, a p-channel TFT is used as the first diode-connecting switch SWc1 as an example. The gate of this p-channel TFT is connected to the scan signal line SL2, and the source and drain of the p-channel TFT are connected to the gate and drain, respectively, of the first drive control element DR1.

The second diode-connecting switch SWc2 is connected between the gate and drain of the second drive control element DR2. In this embodiment, a p-channel TFT is used as the second diode-connecting switch SWc2 as an example. The gate of this p-channel TFT is connected to the scan signal line SL2, and the source and drain of the p-channel TFT are connected to the drain and gate, respectively, of the second drive control element DR2.

The first capacitor C1 is connected between a node ND1' as a constant potential terminal and the gate of the first drive control element DR1. The first capacitor C1 holds the gate-to-source voltage of the first drive control element DR1 substantially constant during a display period following a write period.

The second capacitor C2 is connected between the gate and source of the second drive control element DR2. The second capacitor C2 holds the gate-to-source voltage of the second drive control element DR2 substantially constant during a display period following a write period.

Figure 3:
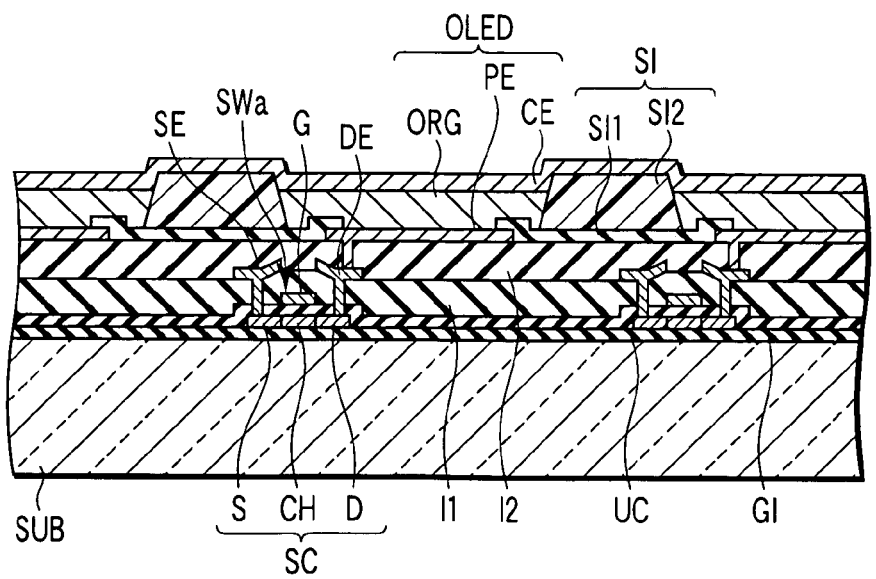
FIG. 3 is a sectional view showing an example of a structure usable in the display shown in FIG. 1.

FIG. 3 is a sectional view showing an example of a structure usable in the display shown in FIG. 1. Although FIG. 3 shows only the output control switch SWa as a TFT, the video signal supply control switch SWb and the diode-connecting switches SWc1 and SWc2 have the same structure as the output control switch Swa. Also, the first drive control element DR1 has substantially the same structure as the output control switch SWa. Furthermore, the second drive control element DR2 has the same structure as the first drive control element DR1 except for the conduction types of a source S and drain D (to be described later).

As shown in FIG. 3, an undercoat layer UC is formed on one main surface of the insulating substrate SUB. As the undercoat layer UC, it is possible to use, e.g., a layered structure of an $SiN_x$ layer and $SiO_2$ layer.

On the undercoat layer UC, patterned polysilicon layers are formed as polycrystalline semiconductor layers SC. The polycrystalline semiconductor layers SC can be formed by, e.g., the following method.

First, an amorphous semiconductor layer is formed on the undercoat layer UC. This amorphous semiconductor layer can be formed by, e.g., plasma enhanced chemical vapor deposition (plasma CVD or PECVD). For example, an amorphous silicon layer can be formed by plasma CVD using silane gas as a source gas.

Then, the amorphous semiconductor layer is melted and recrystallized, and subsequently patterned. In this melting and recrystallization, it is possible to use, e.g., laser annealing using an excimer laser such as an XeCl excimer laser. Also, the semiconductor layer can be patterned by using photolithography and etching. In this way, the polycrystalline semiconductor layers SC are obtained.

In each polycrystalline semiconductor layer SC, the source S and drain D of the TFT are formed away from each other. A region CH between the source S and drain C in the semiconductor layer SC is used as a channel.

Before the formation of a gate G, the polycrystalline semiconductor layer SC undergoes ion doping in order to control the threshold voltage of the TFT. That is, channel doping is performed. An ion beam used in this ion doping can be either a line beam or area beam.

In this embodiment, channel doping for the semiconductor layer SC of the first drive control element DR1 included in each pixel PX is performed simultaneously with channel doping for the semiconductor layer SC of the second drive control element DR2 included in the same pixel PX.

That is, when a line beam is to be used as the ion beam, while the semiconductor layers SC of both the first and second drive control elements DR1 and DR2 are uncovered, the main surface of the substrate SUB on which the polycrystalline semiconductor layers SC are formed is irradiated with the line ion beam, and the irradiation position is moved in a direction crossing the longitudinal direction of the region irradiated with the ion beam.

On the other hand, when an area beam is to be used as the ion beam, while the semiconductor layers SC of both the first and second drive control elements DR1 and DR2 are uncovered, the main surface of the substrate SUB on which the polycrystalline semiconductor layers SC are formed is irradiated with the area ion beam.

The source S and drain D can be formed by, e.g., ion doping using the gate G as a mask. An ion beam used in this ion doping can be either a line beam or area beam. In addition, impurity activation may also be performed, if necessary, in any stage after the ion doping.

Note that the first and second drive control elements DR1 and DR2 are different in conduction types. Therefore, in order to form the source S and drain D in each semiconductor layer SC, the semiconductor layer SC of one of the first and second drive control elements DR1 and DR2 is doped with acceptors as majority carriers, and the semiconductor layer SC of the other of the first and second drive control elements DR1 and DR2 is doped with donors as majority carriers. In this embodiment, the first drive control elements DR1 are p-channel TFTs, so their semiconductor layers SC are doped with acceptors as majority carriers. Since the second drive control elements DR2 are n-channel TFTs, their semiconductor layers SC are doped with donors as majority carriers.

The semiconductor layers SC are covered with a gate insulator GI. A first conductor pattern and an insulating film I1 are sequentially formed on the gate insulator GI. The first conductor pattern is used as the gates G of the TFTs, the first electrodes (not shown) of the capacitors C1 and C2, the scan signal lines SL1 and SL2, and interconnections connecting these components. Also, the insulating film I1 is used as an interlayer dielectric film and as dielectric layers of the capacitors C1 and C2.

A second conductor pattern is formed on the insulating film I1. The second conductor pattern is used as source electrodes SE, drain electrodes DE, the second electrodes (not shown) of the capacitors C1 and C2, the video signal lines DL, the power supply lines PSL1, and interconnections connecting these components. The source electrode SE and drain electrode DE are connected to the source S and drain D, respectively, of the TFT at the positions of through holes formed in the insulating films GI and I1.

An insulating film I2 and a third conductor pattern are sequentially formed on the second conductor pattern and the insulating film I1. The insulating film I2 is used as a passivation film and/or a leveling layer. The third conductor pattern is used as a pixel electrode PE of each organic EL element OLED. In this embodiment, the pixel electrode PE is an anode as an example.

In the insulating film I2, a through hole which communicates with the drain electrode DE connected to the drain D of the output control switch SWa is formed for each pixel PX. Each pixel electrode PE covers the sidewall and bottom surface of this through hole. By such a structure, each pixel electrode PE is electrically connected to the drain D of the output control switch SWa via the drain electrode DE.

A partition insulating layer SI is formed on the insulating film I2. In this embodiment, the partition insulating layer SI has a layered structure including an inorganic insulating layer SI1 and organic insulating layer SI2 as an example. However, the inorganic insulating layer SI1 may be omitted.

In the partition insulating layer SI, through holes are formed at positions of the pixel electrodes PE. In each through hole of the partition insulating layer SI, an organic layer ORG including an emission layer covers the pixel electrode PE. The emission layer is, e.g., a thin film containing a luminescent organic compound which emits red, green, or blue light. The organic layer ORG may also include, e.g., a hole injection layer, hole transporting layer, electron injection layer, and electron transporting layer, in addition to the emission layer. These layers included in the organic layer ORG can be formed by, e.g., an evaporation method using mask or an inkjet method.

A common electrode CE is formed on the partition insulating layer SI and organic layer ORG. The common electrode CE is electrically connected to an electrode interconnection which provides the node ND2, via contact holes (not shown) formed in the insulating films I1 and I2 and the partition insulating layer SI. In this embodiment, the common electrode CE is a cathode as an example.

Each organic EL element OLED is made up of the pixel electrode PE, organic layer ORG, and common electrode CE.

Note that in this display, the substrate SUB, the pixel electrodes PE, and the members interposed between them form an array substrate. As shown in FIG. 1, this array substrate can further include the partition insulating layer SI, scan signal line driver YDR, and video signal line driver XDR.

Figure 4:
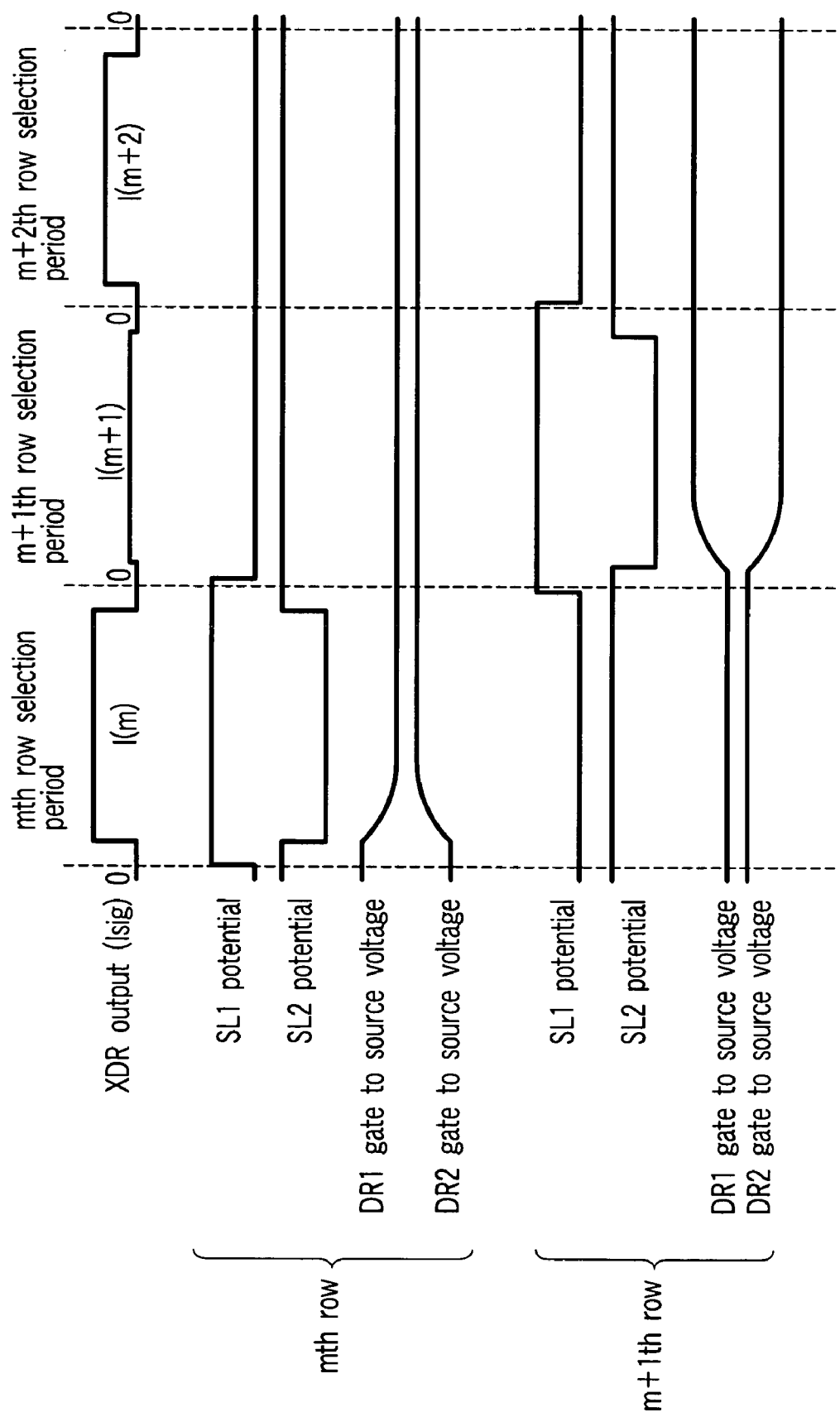
FIG. 4 is a timing chart schematically showing an example of a method of driving the display shown in FIG. 1.

FIG. 4 is a timing chart schematically showing an example of a method of driving the display shown in FIG. 1.

Referring to FIG. 4, the abscissa represents the time, and the ordinate represents the magnitude of an electric potential or electric current. Also, referring to FIG. 4, a waveform indicated by "XDR output ($I_{sig}$)" represents an electric current which the video signal line driver XDR supplies to a certain video signal line DL, and waveforms indicated by "SL1 potential" and "SL2 potential" represent the electric potentials of the scan signal lines SL1 and SL2, respectively. Waveforms indicated by "DR1 gate to source voltage" and "DR2 gate to source voltage" represent the gate-to-source voltages of the drive control elements DR1 and DR2, respectively.

According to the method shown in FIG. 4, the display shown in FIG. 1 is driven as follows.

To display a certain gray level by the pixel PX on the mth row, in a period during which the pixel PX on the mth row is selected, i.e., in an mth row select period, the switch SWa is opened (turned off) by, e.g., changing the electric potential of the scan signal line SL1 from the ON potential (in this method, the Low level) to the OFF potential (in this method, the High level). In a write period during which the switch SWa is open, the following write operation is performed.

That is, first, the switches SWb, SWc1, and SWc2 are closed (turned on) by, e.g., changing the electric potential of the scan signal line SL2 from the OFF potential (in this method, the High level) to the ON potential (in this method, the Low level). In this manner, a node ND3 is connected to the video signal line DL, the drain and gate of the first drive control element DR1 are connected to each other, and the drain and gate of the second drive control element DR2 are connected to each other.

In this state, a video signal is supplied from the video signal line driver XDR to the selected pixel PX via the video signal line DL. That is, the video signal line XDR makes the electric current $I_{sig}$ flow from the power supply terminal ND1 to the video signal line DL. The magnitude of the electric current $I_{sig}$ corresponds to the magnitude of the drive current $I_{drv}$ to be supplied to the display element OLED of the selected pixel PX, i.e., the gray level to be displayed by the selected pixel PX. By this write operation, a gate-to-source voltage $V_{gs1}$ of the first drive control element DR1 and a gate-to-source voltage $V_{gs2}$ of the second drive control element DR2 are set at values when the electric current $I_{sig}$ flows between the nodes ND1 and ND3. Note that the gate-to-source voltages $V_{gs1}$ and $V_{gs2}$ have equal absolute values.

Then, the switches SWb, SWc1, and SWc2 are opened (turned off) by, e.g., changing the electric potential of the scan signal line SL2 from the ON potential to the OFF potential. That is, the node ND3 and video signal line DL are disconnected from each other, the drain and gate of the first drive control element DR1 are disconnected from each other, and the drain and gate of the second drive control element DR2 are disconnected from each other. Subsequently, the output control switch SWa is closed (turned on) by changing the electric potential of the scan signal line SL1 from the OFF potential to the ON potential.

As described above, the write operation sets the gate-to-source voltages of the first and second drive control elements DR1 and DR2 at the values obtained when the electric current $I_{sig}$ flows. These gate-to-source voltages are maintained until the switches SWc1 and SWc2 are closed. In an effective display period during which the switch SWa is closed, therefore, the drive current $I_{drv}$ having a magnitude corresponding to the electric current $I_{sig}$ flows through the display element OLED, and the display element OLED displays a gray level corresponding to the magnitude of the drive current $I_{drv}$.

As described previously, the conventional display using the current mirror circuit in a pixel may cause display unevenness. That is, display unevenness may occur if the second drive control elements DR2, diode-connecting switches SWc2, and capacitors C2 are omitted from the display shown in FIG. 1, and the display is driven by the method shown in FIG. 4. The present inventor examined the cause of this problem, and has found that the threshold voltages of the first drive control elements DR1 in each column formed by the pixels PX vary in a display having no second drive control element DR2, and this causes display unevenness. This will be explained in detail below.

Assume that, in a display having no second drive control element DR2, the same gray level is to be displayed by the pixels PX on the mth and (m+1)th rows connected to the same video signal line DL. In this case, the output electric current $I_{sig}$ of the video signal line driver XDR during a write period of the pixel PX on the mth row is the same as that of the video signal line driver XDR during a write period of the pixel PX on the (m+1)th row.

When the display having no second drive control element DR2 is driven by the method shown in FIG. 4, immediately after the end of the write period of the pixel PX on the mth row, the gate-to-source voltage $V_{gs1}$ of the first drive control element DR1 included in this pixel PX is supposed to be set at a value $V_{gs1}(m)$ obtained when the electric current $I_{sig}$ flows through the source-to-drain path of the first drive control element DR1. Likewise, immediately after the end of the write period of the pixel PX on the (m+1)th row, the gate-to-source voltage $V_{gs1}$ of the first drive control element DR1 included in the pixel PX is supposed to be set at a value $V_{gs1}(m+1)$ obtained when the electric current $I_{sig}$ flows through the source-to-drain path of the first drive control element DR1.

In the display having no second drive control element DR2, however, if the threshold voltages of the first drive control elements DR1 of the pixels PX on the mth and (m+1)th rows are different from each other and the electric current $I_{sig}$ is small, the influence of the parasitic capacitance of the video signal line DL makes it impossible to accurately set the gate-to-source voltage of the first drive control element DR1 included in the pixel PX on the (m+1)th row during the write period of the pixel PX. This makes the magnitudes of the drive currents of the pixels PX on the mth and (m+1)th rows different from each other.

The investigation by the present inventor reveals that the variations of threshold voltage is caused by ion doping to the channel regions CH of the polycrystalline semiconductor layers SC, i.e., channel doping. That is, the variations of threshold voltage is caused by the variations of impurity concentration in the channel regions CH of the polycrystalline semiconductor layers SC.

It is extremely difficult to eliminate the variations of impurity concentration in the channel region CH throughout the whole display region. However, in a very small region, e.g., in a region occupied by one pixel PX, the impurity concentration in the region CH is substantially even. This embodiment prevents display unevenness by using this phenomenon as will be explained below.

Figure 5:
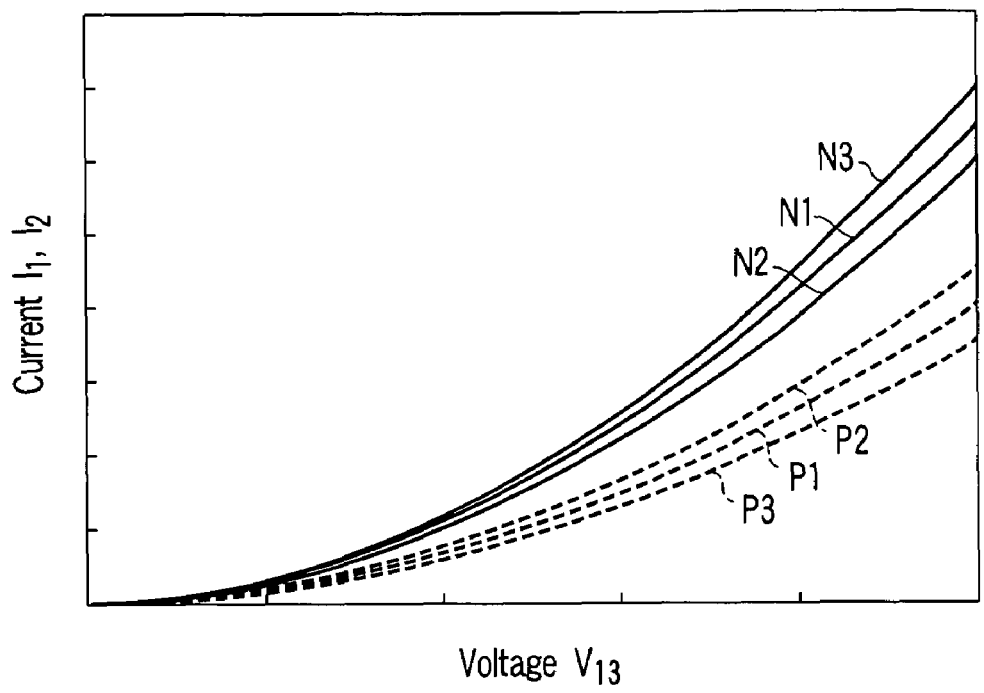
FIG. 5 is a graph showing examples of the characteristics of the first and second drive control elements included in one pixel.

FIG. 5 is a graph showing examples of the characteristics of the first and second drive control elements included in one pixel. Referring to FIG. 5, the abscissa represents a voltage $V_{13}$ between the nodes ND1 and ND3 in an absolute value. The ordinate represents an electric current $I_1$ which flows through the source-to-drain path of the first drive control element DR1 and an electric current $I_2$ which flows through the drain-to-source path of the second drive control element DR2. Curves P1 to P3 represent the characteristics of the first drive control element DR1. Curves N1 to N3 represent the characteristics of the second drive control element DR2.

When the impurity concentrations in the channel regions CH of the first and second drive control elements DR1 and DR2 are equal to each other in each pixel PX, a threshold voltage $V_{th2}$ of the second drive control element DR2 shallows if the impurity concentration in the channel region CH is changed to deepen a threshold voltage $V_{th1}$ of the first drive control element DR1. By contrast, if the impurity concentration in the channel region CH is changed to shallow the threshold voltage $V_{th1}$ of the first drive control element DR1, the threshold voltage $V_{th2}$ of the second drive control element DR2 deepens.

Accordingly, assuming that the first and second drive control elements DR1 and DR2 have the characteristics indicated by the curves P1 and N1, respectively, in a certain pixel PX, the first and second drive control elements DR1 and DR2 have, e.g., the characteristics indicated by the curves P2 and N2, respectively, in a pixel PX having a threshold voltage $V_{th1}$ deeper than that of the former pixel PX. Also, in a pixel PX having a shallower threshold voltage $V_{th1}$, the first and second drive control elements DR1 and DR2 have, e.g., the characteristics indicated by the curves P3 and N3, respectively.

That is, when the voltage $V_{13}$ between the nodes ND1 and ND3 is constant, the electric current $I_2$ flowing through the drain-to-source path of the second drive control element DR2 decreases if the electric current $I_1$ flowing through the source-to-drain path of the first drive control element DR1 increases. By contrast, if the electric current $I_1$ flowing through the source-to-drain path of the first drive control element DR1 decreases, the electric current $I_2$ flowing through the drain-to-source path of the second drive control element DR2 increases.

The electric current $I_{13}$ flowing between the nodes ND1 and ND3 is equal to the sum of the electric current $I_1$ flowing through the source-to-drain path of the first drive control element DR1 and the electric current $I_2$ flowing through the drain-to-source path of the second drive control element DR2. In this display, therefore, the variations in characteristics of the first drive control elements DR1 and the variations in characteristics of the second drive control elements DR2 have no large influence on the relationship between the voltage $V_{13}$ and electric current $I_{13}$. That is, the variations in impurity concentrations of the channel regions CH have no large influence on the relationship between the voltage $V_{13}$ and electric current $I_{13}$.

Accordingly, when, for example, the same video signal $I_{sig}$ is to be written in the pixels PX on the mth and (m+1)th rows of this display, it is almost unnecessary to change the electric potential of the video signal line DL. Therefore, even when the video signal $I_{sig}$ is small, the magnitudes of the drive currents $I_{drv}$ for the pixels PX on the mth and (m+1)th rows can be made substantially equal to each other. This makes it possible to prevent display unevenness.

Figure 6:
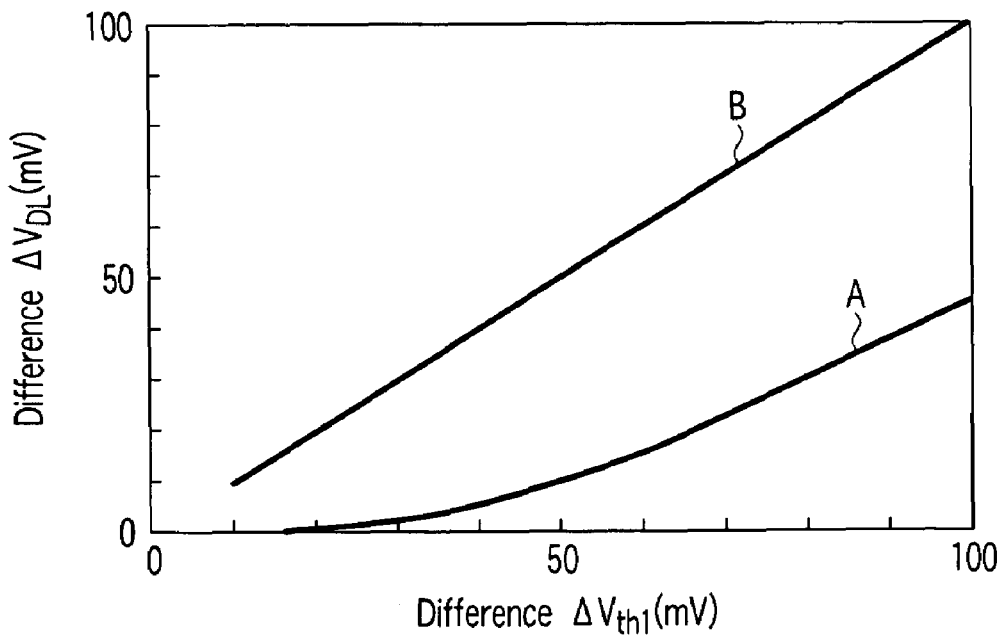
FIG. 6 is a graph showing examples of influences that the variations in characteristics of the drive control elements have on the electric potential of the video signal line.

FIG. 6 is a graph showing examples of influences that the variations in characteristics of the drive control elements have on the electric potential of the video signal line. Referring to FIG. 6, the abscissa represents a difference $\Delta V_{th1}$ between the threshold voltage $V_{th1}$ of the first drive control element DR1 included in the pixel PX on the (m+1)th row and that of the first drive control element DR1 included in the pixel PX on the mth row. The ordinate represents a difference $\Delta V_{DL}$ between an electric potential $V_{DL}$ of the video signal line DL to be set for writing the video signal $I_{sig}$ in the pixel PX on the (m+1)th row and an electric potential $V_{DL}$ of the video signal line DL to be set for writing the video signal $I_{sig}$ in the pixel PX on the mth row, when the same video signal $I_{sig}$ is to be written in the pixels PX on the mth and (m+1)th rows. A curve A represents data obtained for the display shown in FIG. 1. A curve B represents data obtained for a display having substantially the same structure as the display shown in FIG. 1 except that the second drive control elements DR2, second diode-connecting switches SWc2, and second capacitors C2 are omitted. Note that the data shown in FIG. 6 is obtained by simulation performed by assuming the following conditions.

That is, for the data represented by the curve A, the width and length of the semiconductor layers SC of the first and second drive control elements DR1 and DR2 were set at 12.5 and 12 μm, respectively. The mobility was set at 110 $cm^2 \cdot V^{-1} \cdot sec^{-1}$ for each of the first and second drive control elements DR1 and DR2. The absolute value of the threshold voltage of each of the first and second drive control elements DR1 and DR2 included in the pixel PX on the mth row was set at 2.5V. In both the pixels PX on the mth and (m+1)th rows, the difference between the threshold voltages $V_{th1}$ and $V_{th2}$ of the first and second drive control elements DR1 and DR2 was set at 5V. The magnitude of the video signal $I_{sig}$ to be written in the pixels PX on the mth and (m+1)th rows was set at 0.1 µA.

On the other hand, for the data represented by the curve B, the width and length of the semiconductor layer SC of the first drive control element DR1 were set to 25 and 12 µm, respectively. The mobility of the first drive control element DR1 was set at 110 cm$^2$·V$^{-1}$·sec$^{-1}$. The absolute value of the threshold voltage of the first drive control element DR1 included in the pixel PX on the mth row was set at 2.5V. The magnitude of the video signal $I_{sig}$ to be written in the pixels PX on the mth and (m+1)th rows was set at 0.1 µA.

As is apparent from the curve B shown in FIG. 6, when the second drive control elements DR2 and the like are omitted, the difference $\Delta V_{DL}$ largely increase as the difference $\Delta V_{th1}$ increase. That is, in a display from which the second drive control elements DR2 and the like are omitted, if the threshold voltages $V_{th1}$ of the first drive control elements DR1 of the pixels PX on the mth and (m+1)th rows are different, the electric potential $V_{DL}$ of the video signal line DL must be largely changed in order to write the same video signal $I_{sig}$ as written in the pixel PX on the mth row into the pixel PX on the (m+1)th row. If the video signal $I_{sig}$ is small, therefore, the write of the video signal $I_{sig}$ cannot be completed within the write period of the pixel PX on the (m+1)th row, and this sometimes causes display unevenness.

By contrast, in the display shown in FIG. 1, as is evident from the curve A shown in FIG. 6, the increase in difference $\Delta V_{DL}$ with respect to the increase in difference $\Delta V_{th1}$ is half or less than that when the second drive control elements DR2 and the like are omitted. That is, in the display shown in FIG. 1, even if the threshold voltages $V_{th1}$ of the first drive control elements DR1 of the pixels PX on the mth and (m+1)th rows are different, the electric potential $V_{DL}$ of the video signal line DL need not be largely changed in order to write the same video signal $I_{sig}$ as written in the pixel PX on the mth row into the pixel PX on the (m+1)th row. Therefore, even when the video signal $I_{sig}$ is small, the write of the video signal $I_{sig}$ can be completed within the write period of the pixel PX on the (m+$_1$)th row. That is, display unevenness can be prevented.

The orientation of the semiconductor layer SC of the first drive control element DR1 may also be substantially equal to that of the semiconductor layer SC of the second drive control element DR2. In this case, the conditions such as the grain boundaries of the semiconductor layers SC of the first and second drive control elements DR1 and DR2 become substantially equal. In each pixel PX, therefore, it is possible to decrease the influence of, e.g., the crystallinity of the semiconductor layers SC on the difference between the characteristics of the first and second drive control elements DR1 and DR2.

As has been explained above, drive control elements obtained by connecting thin film transistors different in conduction type in parallel are arranged close to each other and formed in the same step. Accordingly, even if the threshold voltages of these drive control elements vary between pixels, the threshold voltage difference between the two channels can be held constant. This can be achieved by making the channel doping conditions of the two thin film transistors equal to each other. So, the channel doping processes may be performed at the same time in the same step, or no channel doping may be performed for either channel.

Various modifications of this display are possible.

Figure 7:
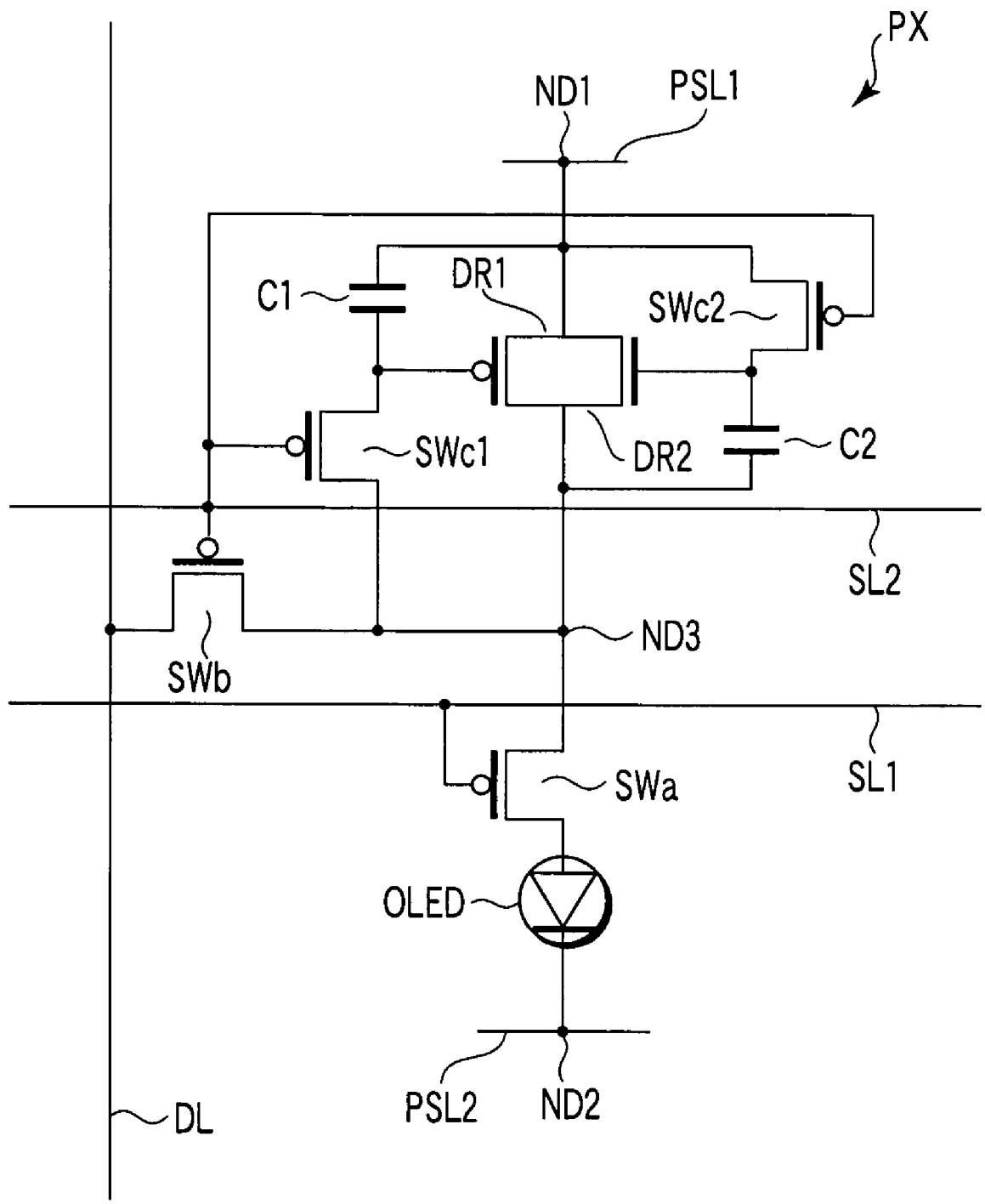
FIG. 7 is an equivalent circuit diagram of a pixel included in a display according to a modification.

FIG. 7 is an equivalent circuit diagram of a pixel included in a display according to a modification. The pixel PX has the same structure as the pixel PX shown in FIG. 2 except that the first capacitor C1 is connected between the gate and source of the first drive control element DR1. This structure obviates the need for a constant potential line which provides a node ND1'.

In the pixels PX shown in FIGS. 2 and 7, the first diode-connecting switch SWc1 is connected between the gate and drain of the first drive control element DR1. However, the first diode-connecting switch SWc1 may be connected between the gate of the first drive control element DR1 and the video signal line DL. Alternatively, it is also possible to connect the video signal supply control switch SWb and first diode-connecting switch SWc1 in series in this order between the video signal line DL and the drain of the first drive control element DR1, and connect the drain of the first diode-connecting switch SWc1 to the gate of the first drive control element DR1.

Also, in the pixels PX shown in FIGS. 2 and 7, p-channel TFTs are used as the output control switch SWa, video signal supply control switch SWb, and first and second diode-connecting switches SWc1 and SWc2. However, n-channel TFTs may be used as these switches.

Furthermore, in the pixels PX shown in FIGS. 2 and 7, the nodes ND1 and ND2 are a high-potential power supply terminal and low-potential power supply terminal, respectively. However, the nodes ND1 and ND2 may be a low-potential power supply terminal and high-potential power supply terminal, respectively. In this case, an n-channel TFT and p-channel TFT are used as the first and second drive control elements DR1 and DR2, respectively, and the anode and cathode of the organic EL element OLED are connected to the power supply line PSL2 and output control switch SWa, respectively.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An array substrate comprising an insulating substrate, pixel circuits arranged in a matrix form on the insulating substrate, and video signal lines arranged correspondently with columns which the pixel circuits form, wherein each of the pixel circuits comprises:

a first thin film transistor including a polycrystalline semiconductor layer in which source, drain and channel are formed, the source of the first thin film transistor being connected to a first power supply terminal;

a second thin film transistor different in conduction type from the first thin film transistor and including a polycrystalline semiconductor layer in which source, drain and channel are formed, the source of the second thin film transistor being connected to the drain of the first thin film transistor, and the drain of the second thin film transistor being connected to the first power supply terminal;

a first capacitor connected between a constant potential terminal and a gate of the first thin film transistor;

a second capacitor connected between the source of the second thin film transistor and a gate of the second thin film transistor;

switch group including a first diode-connecting switch and a video signal supply control switch and switching a connection state between first and second states, the first state being a state that the gate of the first thin film transistor, the drain of the first thin film transistor, and the video signal line are electrically connected to one another, and the second state being a state that the gate of the first thin film transistor, the drain of the first thin film transistor, and the video signal line are electrically disconnected from one another;

a second diode-connecting switch connected between the source of the second thin film transistor and the gate of the second thin film transistor; and an output control switch which is to be connected in series with a display element between a second power supply terminal and the drain of the first thin film transistor.

2. The array substrate according to claim 1, wherein a concentration of an impurity in the channel of the first thin film transistor is substantially equal to a concentration of an impurity-in the channel of the second thin film transistor.

3. The array substrate according to claim 1, wherein the first diode-connecting switch is connected between the gate of the first thin film transistor and the drain of the first thin film transistor, and wherein the video signal supply control switch is connected between the video signal line and the drain of the first thin film transistor.

4. The array substrate according to claim 1, wherein the polycrystalline semiconductor layers of the first and second thin film transistors are polycrystalline silicon layers.

* * * * *